United States Patent [19]

Kallman

[11] 4,342,013
[45] Jul. 27, 1982

[54] BIDIRECTIONAL POWER LINE FILTER

[75] Inventor: Mathew R. Kallman, East Norwich, N.Y.

[73] Assignee: Pilgrim Electric Co., Plainview, N.Y.

[21] Appl. No.: 181,017

[22] Filed: Aug. 25, 1980

[51] Int. Cl.$^3$ .......................... H03H 7/01; H03H 7/09
[52] U.S. Cl. ....................................... 333/181; 177/185
[58] Field of Search ...................... 333/12, 24 R, 24 C, 333/167–172, 175–185, 204, 238, 246; 361/113, 118, 119

[56] References Cited

U.S. PATENT DOCUMENTS 3,683,271  8/1972  Kobayashi ...................... 333/177 X

FOREIGN PATENT DOCUMENTS 53-64446  6/1978  Japan .................................... 333/185
569700  11/1945  United Kingdom ................. 333/181

OTHER PUBLICATIONS

News Release—"Pilgrim Introduces New Bi-Directional Filter for O.E.M. Use", Pilgrim Electric Company, Plainview, N.Y., dated Apr. 15, 1980, 2 pages.

Curran—"Power Line Filter", IBM Technical Disclosure Bulletin, vol. 7, No. 7, Dec. 1964, p. 569.

Primary Examiner—Marvin L. Nussbaum
Attorney, Agent, or Firm—Nolte and Nolte

[57] ABSTRACT

A bidirectional power line filter provides distributive capacitance to accomplish filtering is electrically connected between the power lines and the ground wire in a power distribution system. In addition to lumped parameter or fixed value capacitors, a distributive capacitance is provided by use of a printed circuit board upon which the electrical components forming the filter are mounted. A specially formed dual inductor is wound as a common-core inductor using two toroidal cores preferably formed of ferrite each having a different permeability verus frequency curve. The inventive filter is intended for use in a three-phase Y-connected power distribution system, as well as in a conventional single-phase system. An additional multiple outlet system may be added to the bidirectional filter and it is also formed having distributive capacitance by employing a length of printed circuit board material to which the plurality of outlets are connected.

14 Claims, 5 Drawing Figures

BIDIRECTIONAL POWER LINE FILTER

BACKGROUND OF THE INVENTION

The present invention relates to filters and, more specifically, relates to filters for placement in the power line of electronic equipment to protect such equipment from damage and/or malfunction.

The problem of power line pollution has become more and more evident as of late. Typically, such power line pollution involves individual transients which are of varying duration and voltage and current surges which ride on top of, or are superimposed onto, the 60 Hz waveform. Such surges or transients represent approximately 90% of the problems in power line pollution, with the other 10% being represented by brownouts and occasional blackouts. Transients may also be called surges, spikes, power bumps, over voltages, over shoots, electrostatic discharge (ESD), and radio frequency interference (RFI).

When power line surges or transients occur that are of sufficient magnitude to cause the electrical equipment to cease functioning, this can be immediately detected. However, modern electronic data processing equipment and other similar sophisticated electronic equipment can be adversely affected by such transients yet still not cease to operate. For example, voltage spikes or transients on the power line may cause memories to read or write ones instead of zeroes, to affect adversely the central processing unit, and to disrupt the input/output bus and controller regulating circuitry, all of which can ultimately cause error, data loss, or disruption of the priority interrupt system. Thus, the effects of these low-level transients are oftentimes more serious and insidious than simply dropping out the over-voltage protector, i.e., opening the main power circuit breaker. It has now been learned that such low-level transients are actually responsible for many apparently unexplained or random failures in electronic data processing equipment.

The power companies supplying power have altered their power grid networks in order to overcome the brownout and blackout problem; however, since computers and other sensitive electronic equipment represent less than 0.01% of the total national power load, the utility companies do not view the problems discussed as major, since the present power quality is certainly adequate for conventional electrical equipment such as lights, heaters, motors, and the like. Ironically, it is this conventional electrical equipment whose operation adversely affects the power being fed to the computers and other complex electronic equipment. Fluorescent lighting, copiers, teletype equipment, and paging systems all place demands upon the power system which can create unwanted and undesirable power line transients. Additionally, in the past, electrical equipment was turned on and off by means of simple switches, but today the use of electronic or solid-state devices has become very popular. While replacing electromechanical devices with solid-state devices has its advantages, there are also severe disadvantages. Specifically, extensive voltage spikes are generated by these electronic switches. For example, one need only monitor the output voltage of an SCR type elevator controller to see the extent of these voltage spikes. These spikes adversely affect almost all types of sensitive electronic equipment. Moreover, computers themselves, as well as computer peripherals, can generate transients and transient noise, which can contaminate the power line. This then can create problems for the other electronic equipment on the line.

These problems are of such magnitude that several European countries have promulgated regulations regarding the generation of transients by computers and their peripherals. More recently, the Federal Communications Commission has also set forth rules limiting the extent to which computers, electronic games, and other electronic devices may pollute the power lines and, thus, create interference inimicable to radio communications.

With the vast majority of complex electronic equipment using not only transistors but also integrated circuits, and with such integrated circuits now being constructed with large scale integration (LSI), this problem has achieved major proportions. This is particularly true, since most fast rise-time, short-duration transients contain a high-frequency spectra to which transformers, motors, heaters, lights, vacuum tubes, and electromechanical instruments are relatively immune but which are anathema to modern solid-state electronic equipment. The integrated circuit devices are generally safe from any damage by such fast rise-time, short-duration transients, but the high frequency spectrum frequently disrupts the operation of the device.

Accordingly, there exists a need to provide clean power to complex data processing equipment in order to preclude equipment damage, as well as to prevent any malfunctioning of the equipment.

SUMMARY OF THE INVENTION

The present invention provides a passive electrical filter system which bidirectionally suppresses power line surges, spikes, and transients, as well as electromagnetic interference (EMI) and radio frequency interference (RFI). The filter has a high surge current capability, as well as providing bidirectional protection. Additionally, the filter provides protection both in the common mode, i.e., power line to chassis ground, and in the transverse mode, i.e., power line to power line, and is relatively insensitive to load and line impedances.

The invention recognizes that line-to-ground filtering is necessary in addition to line-to-line filtering and thus provides for this contingency. Self-generated and external RFI/EMI suppression is provided, as is protection against transients caused by lightning and inductive load switching. A filter is provided which employs a common-core inductor, as well as discrete capacitors, all mounted on a circuit board which itself has capacitive properties at high frequencies. This provides maximum common mode rejection with minimum current leakage to the chassis of the equipment being protected.

Additionally, a distributive capacitance provided by an inventive circuit board, as well as lumped parameter components that are connected in parallel with the distributive capacitance, are taught.

The distributive capacitance can also be used as a means to connect multiple power outlets to the inventive protective circuit.

A specially formed, high-permeability, ferrite common-core multiple inductor is employed to provide attenuation of common-mode interference at lower frequencies. The inventive multiple inductor portion of the filter is capable of withstanding the high current demands of the equipment, while also meeting the practical size, weight, and thermal constraints necessary to a functionally meaningful unit. The invention also teaches the use of multiple common toroidal ferrite cores.

Therefore, it is an object of the present invention to provide a bidirectional filter system, for use with sensitive electronic equipment, which provides line-to-line and line-to-chassis filtering.

It is another object of the present invention to provide a filter system which has a high insertion loss even at very high frequencies, i.e., in the Gigahertz region.

The manner in which these and other objects are accomplished by the present invention will become clear from the following detailed description.

DETAILED DESCRIPTION OF THE INVENTION

The present invention involves the discovery of the principal cause of the failure of present day filters to accomplish filtering of high-frequency spectra from fast rise time, short-duration transients. Specifically, the present invention recognizes that transients on the AC power line enter the typical system in what is referred to as the common mode or line to chassis ground mode. After extensive study, it has been found that typical conventional power supplies do not provide filtering in this mode. Most power supplies use only line-to-line filtering and not line to ground. Therefore, the high-frequency transient energy enters the logic circuits through the power supply. This is generally the case, since most computers and other microelectronic logic circuitry use ground as a reference potential and, thus, line-to-ground disturbances easily cause logic errors. Moreover, the present invention recognizes that even computers that do not use chassis ground as the logic ground, i.e., circuits which operate in a differential manner, are nonetheless susceptible to disruption because of the stray impedances that exist in the 5-100 MHz region. Additionally, almost all input/output cables can act as resonant links in this range.

The present invention provides a unitary, bidirectional power line filter which filters both self-generated and external RFI/EMI radiation. Additionally, protection against transients caused by lightning and inductive load switching is also provided in order to prevent permanent damage to delicate electronic data processing devices and to other sensitive electronic equipment containing low voltage level logic circuitry.

The inventive embodiment described hereinafter relates to a design based on an Electromagnetic Compatability Analysis and Design (EMCAD) Worst Case EDP computer analysis. In that analysis, the EDP equipment is assumed to contain a switching inverter type power supply, advanced Schottky logic, CRT deflection amplifiers, disc stepper motor control functions, and print solenoids.

Figure 1:
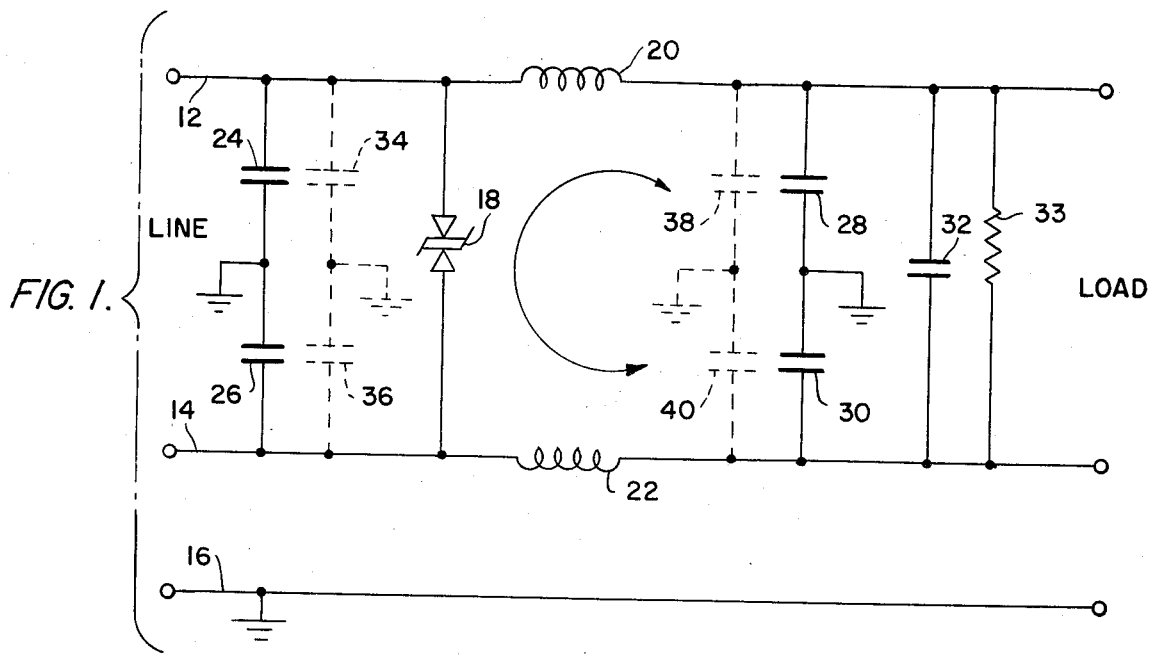
FIG. 1 is a circuit diagram in schematic form of the present invention for use with a single-phase power system.

The invention incorporates both common mode and normal mode decoupling and provides protection against conductive power line interference. The preferred embodiment, as shown in FIG. 1, comprises a pi filter employing a specially constructed common-core dual inductor. More specifically, and referring to FIG. 1, single-phase, three-wire power lines are represented by the phase line 12, the return or neutral line 14, and the ground wire 16. Zener diodes should be placed across lines 12 and 14 to protect against damaging over voltages. The present embodiment uses a commercial double zener diode 18 known as a Transzorb, manufactured by General Semiconductor. These Transzorb elements have a larger junction than conventional application zener diodes and are able to withstand greater voltages without burn out. The inductors 20, 22, in conjunction with bypass capacitors, achieve maximum common mode rejection with minimum current leakage to the equipment chassis. The inventive filter has high frequency capabilities and provides over 30 db of insertion loss up to and including 10 GHz, thereby providing protection against broadcast band, high-power radar, and microwave radiation sources. The present invention achieves this high-frequency capability by including distributed capacitance in parallel with lumped parameter capacitors. The lumped capacitance components in the preferred embodiment are provided by four high-voltage rated ceramic capacitors 24, 26, 28, and 30, having capacitive values between 0.001 to 0.005 microfarads. In this embodiment these ceramic capacitors are rated at 3-4 kilovolts.

One end of each of the ceramic capacitors 24, 26, 28, and 30, is connected to ground, i.e., to line 16. The other ends of capacitors 24, 26 are connected to the input side of lines 12 and 14, respectively. Another fixed capacitor 32 is across lines 12 and 14 at the load side and this capacitor 32 is preferably a 1.5 microfarad high-efficiency, metal coated dielectric film capacitor. Capacitor 32 in conjunction with resistor 33 serve to permit dissipation of the voltages present on the capacitors when the unit is shut off.

Figure 2:
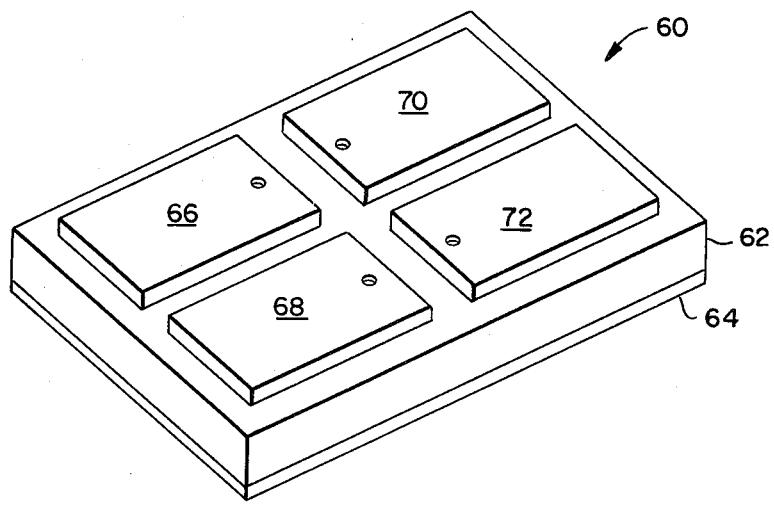
FIG. 2 is a perspective of the distributive capacitor of the inventive filter formed as a circuit board.

The fixed 0.001 microfarad ceramic capacitors 24, 26, 28, and 30, will self-resonate at frequencies from between 20 to 30 MHz. Accordingly, the filtering efficiency of these lumped parameter capacitors is limited to frequencies below their self-resonant frequency. The present invention overcomes this frequency limitation by the use of a two-sided, copper-clad printed circuit board, upon which the discrete components are mounted. This printed circuit board is shown in FIG. 2 and is etched in an inventive pattern which provides additional capacitance, in the form of 400-800 picofarads of distributed capacitance, and which is electrically in shunt with each of the high-voltage ceramic capacitors connected to the phase and neutral lines. This distributed capacitance is represented by four discrete capacitors shown in phantom at 34, 36, 38, and 40. These capacitors are shown in phantom because of their distributive nature and in order to distinguish them from the lumped parameter capacitors. There is distributive capacitance provided between the phase line 12 and ground 16 and the neutral line 14 and ground 16 at both the input or line side and the output or load side of the inventive filter.

By employing these synthesized distributed capacitors as shown in FIG. 2, it is possible to have the capacitors act as a transmission line when the frequency reaches a sufficiently high level, approximately 10–20 MHz. In this fashion, the synthesized capacitors become effective attenuators over the desired frequency ranges and continue to be effective up to and into the Gigahertz region and never present the self-resonant problem of the fixed parameter capacitors.

Referring now to FIG. 2, the manner in which these synthesized capacitors are formed is shown. Specifically, a double-clad printed circuit board 60 is employed with the conductor on one surface etched in a preselected pattern. A glass substrate 62 is sandwiched between a bottom conductor 64 and an upper conductor which has been etched into the inventive pattern comprising conductor lands 66, 68, 70, and 72. Suitable holes are formed in the conductor lands 66, 68, 70, and 72 so that the inductors 20, 22 can be electrically connected to the distributed capacitance, in accordance with the schematic of FIG. 1. Other electrical connections, not shown, are made on the board 60 in keeping with the circuit of FIG. 1.

As an illustration of the extent to which the synthesized capacitance can be obtained using 1/64 inch thick, G-10, double-clad copper printed circuit board, it is possible to obtain 72 picofarads per square inch of area of board. Attenuation of the unwanted signals will increase at 20 db per decade, until the frequency at which the synthesized capacitor begins to act like a transmission line, i.e., a section of stripline, and it will then provide a constant attenuation regardless of subsequent frequency increases. One consideration which must be kept in mind when attempting to follow the inventive teachings regarding combining distributive capacitance in shunt with discrete capacitors is that the self-resonant frequency of the discrete capacitor must be greater than the frequency at which the distributive capacitance becomes effective. This frequency is determined by the equation of:

$$f = 1/(2\ C_1 Z_s)$$

In order to provide attenuation of unwanted and harmful low-frequency transients, the present invention teaches the use of a high-permeability ferrite common-core dual inductor to achieve attenuation of common-mode interference. While making a determination of the required inductance is essentially a straight forward design function, it is pointed out that when attempting to achieve a useable, workable size in terms of volume, weight, and thermal constraints the problem becomes substantially more difficult. For example, to minimize self heating of the inductor requires minimizing the resistance of the copper winding which, in turn, means utilizing a core which has a maximum permeability. High permeability can be obtained by using a ferrite core, however, maximum operating frequencies of high permeability ferrite cores are inversely related to their initial permeability.

As indicated above, the present invention requires a relatively large amount of inductance to provide sufficient inductive reactance at low frequencies, i.e., frequencies less than 200 KHz. However, it is known that the greater the inductance of an inductor, such as a balun, the lower the self-resonant frequency is. It is also known that the only ways to increase the resonant frequency is to either reduce the inductance or reduce the shunt capacitance. In the present situation, the shunt capacitance represents only 2–4 picofarads and, thus, significant decreases are essentially impossible. Moreover, reducing the number of turns of the inductor would reduce the inductance over the entire operating frequency range and would adversely affect and degrade the necessary low frequency performance. The present invention obtains the required inductance by the use of two manganese-zinc (Mn-Zn) ferrite cores arranged concentrically and having two windings to accomplish the desired suppression of the low-frequency transients. Manganese-zinc ferrites can be used at frequencies up to approximately 10 MHz and this upper limit frequency is sufficient for the inventive filter design.

The initial permeability ($\mu i$) of Mn-Zn ferrite normally ranges from several hundred up to a usable maximum of approximately 12,000. Typically, such permeability remains constant as frequency increases, until the permeability begins to roll off sharply. This roll off typically occurs at a rate of approximately 1200 per decade. By starting with the relatively high initial permeability inherent in this material, i.e., 10,000–12,000, and having it drop off with increasing frequency so as to reach approximately 1,000 at 10 MHz, the desired inverse relationship between inductance and frequency is achieved by the inventive common-core dual inductor.

The present invention teaches the stacking of two or more manganese-zinc ferrite toroids prior to winding the inductor. The inventive inductor 80 is formed with two Mn-Zn toroidal cores 82, 84 forming a common core for the windings 86. As an example, a common-core choke having an inductance of 4 MH per side at 1 KHz may be obtained by employing cores 82, 84 formed of a ferrite material that has an initial permeability ($\mu$) of 10,000. Such ferrite material is manufactured by TDK Electronics Co., Ltd. and is identified as H5C2 material. Accordingly, upon selecting a toroidal core made of this ferrite, namely T52-72-10 having an inductance factor of 6450, it can be determined that twenty-four turns of wire are required to obtain the required inductance, i.e., 4 MH per side. The windings 86 can be bifilar, although this is not a necessity.

The inductive reactance of a choke formed as above at 1 KHz is 30 ohms. Theoretically, the inductive reactance will vary directly with frequency if the permeability remains constant. Thus, provided that the permeability of the core does not change, the inductive reactance would equal 30 Kohms at 1 MHz, 300 Kohms at 10 MHz, and so on. Nevertheless, the permeability of the ferrite material remains at its initial value only up to 100 KHz, whereupon it begins to fall off to approximately 1,000 at 1 MHz and approaches the permeability of air at 2 MHz.

Figure 3:
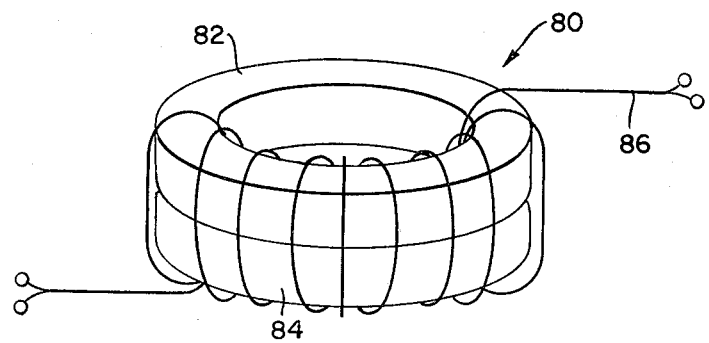
FIG. 3 is a perspective of the inventive common-core multiple inductor.

FIG. 3 shows the preferred embodiment of the inventive dual inductor 80. Two ferrite cores 82, 84 are concentrically arranged and the copper wires wound thereon in the conventional fashion. The present invention, as embodied in FIG. 1, employs two inductors 20, 22 and these are achieved in this embodiment by utilizing a bifilar winding 86. Nevertheless, it is not necessary to use a bifilar winding and two separate individual copper wire windings could be employed.

The inventive filter is designed so that it requires less and less inductive reactance as the frequency increases into the MHz region and, if an inductive reactance of 30 Kohms were maintained in the frequency range of 1 MHz to 10 MHz, only 400 $\mu$H of inductance would be needed at the 10 MHz frequency level. Therefore, the present invention teaches that by using the same inductor geometry, i.e., dimensions, number of turns, etc., the inductance factor of the second core need only be 640 at 10 MHz. Calculating the operating permeability at this frequency results in a value of 1,000. As indicated, the operating permeability of the H5C2 material remains relatively constant only up to 100 KHz. Thus, the present invention teaches the selection of the second core formed of material such that its operating permeability at 10 MHz is 1,000. By selecting a core of material having an inductance factor of 640 at 10 MHz, it is possible to stack two cores, one on top of the other, and utilize a single phase winding 20 and a single neutral winding 22. This, of course, requires that the operating permeability versus frequency characteristic of the second core is such that it is possible to obtain sufficient inductance in the frequency region about 1 MHz. As an example of some suitable materials, the H6F material produced by the TDK corporation has a $\mu i$ of approximately 600 and, with 24 turns of wire, has an inductance of approximately 350 $\mu H$. At 10 MHz its permeability is approximately equal to 400 and, with the same size core as the first one, the inductance factor is 520. Accordingly, with 24 turns this inductor has a value of approximately 350 $\mu H$ up to a maximum frequency of 6 MHz. At 10 MHz the core permeability is approximately equal to 400, hence, it has an inductance factor of approximately 260. This results in an inductance of 175 $\mu H$ at 10 MHz, and the inductive reactance is approximately 8,000 ohms.

The instant embodiment utilizes approximately 0.005 microfarads total capacitance to ground for which the capacitive reactance is approximately equal to 50 ohms at 10 MHz. This provides a theoretical 4 db attenuation at 1 MHz. Similarly, at 6 MHz the capacitive reactance is 50 ohms, while the inductive reactance equals approximately 10 ohms which, while providing slightly less attenuation, has still proven to be an adequate level. Accordingly, it may be seen that the required inductor performance is provided by the use of two cores wound as a common-core, dual, toroidal inductor.

While the foregoing discusses what is considered a major threat to the integrity of microelectronic devices and describes a means for dealing with it effectively, there also exist other phenomena that very commonly not only disrupt but destroy microelectronic circuits. These phenomena are termed spikes, or voltage/current, transients. They are, in effect, short duration excursions that ride on top of the basic 60 Hertz sine wave. They are usually caused by inductive load switching and induced lightning effects and quite commonly can reach amplitudes of several kilovolts and have pulse durations of up to several hundred microseconds. Conventionally, these spikes are handled by clamping techniques, namely, shorting the spikes out. A simple example of a circuit that would be capable of dealing with such transients could consist of zeners, i.e., so called avalanche diodes, or metal oxide or thyrite varistors.

All of these circuit elements have variable resistance in relation to preestablished voltage levels and drop from a megohm to only a few ohms when that voltage level is reached. The present invention contemplates a circuit consisting of such devices arranged between the phase and the neutral wire to protect against transverse mode effects and between each of the above respective wires and the green wire, or circuit ground, to protect against a common mode threat. Ahead of these semiconductors or clamping devices, and separated from them by a smaller inductor in each of the black and white wires, would be a three element gas tube. The values of the elements would be chosen so that the semiconductors would clamp at 200–250 volts and the gas tube would clamp at between 300 and 500 volts. In the rare instance that a transient occurs that is not in the wrong direction but of insufficient voltage level to fire the gas tube, the invention contemplates incorporating an automatically resettable power interrupter to protect the components from burning out.

Figures 4, 5:
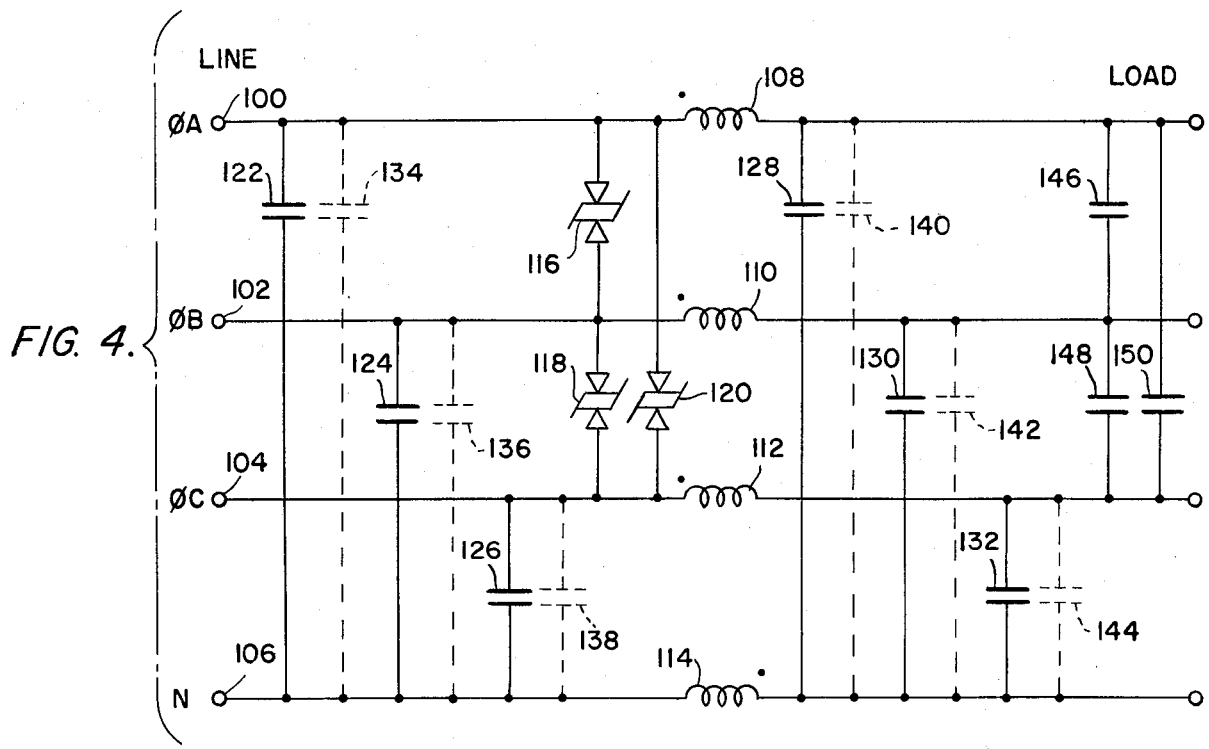
FIG. 4 is a circuit diagram in schematic form of the inventive system for use with a three-phase, four-wire power system.
FIG. 5 is a circuit diagram in schematic form of the inventive distributive capacitor uses to connect multiple power outlets to the protective circuit of FIG. 1.

FIG. 4 shows the inventive circuit of FIG. 1, i.e., the bidirectional power line filter in a configuration suitable for interconnection with a three-phase Y connected power distribution system. The three-phase power lines are 100, 102, and 104, with the neutral line being shown at 106. Because the inventive filter is bidirectional, essentially identical components are arranged electrically on either side of the inductors 108, 110, 112, and 114 in the A, B, C and neutral lines, respectively. The zener diode protection need only be connected from line to line and, because this is a three-phase system, three such Transzorb diodes, 116, 118, and 120 are employed. These are arranged in the line side of the three-phase power connection to the inventive filter, since the load would not be generating spikes which would be of a magnitude to require diode suppression. Additionally, the present filter teaches capacitive filtering connected from line to neutral and, accordingly, there are three lumped parameter capacitors 122, 124, and 126 connected in the line side of the inventive filter from the appropriate phase lines to the neutral line. Similarly, three identical capacitors 128, 130, and 132 are connected in the load side from the phase lines to the neutral line. The use of distributive capacitance is also employed in this three-phase filter and again, as in FIG. 1, the distributive capacitance is represented as being between the phase lines to the neutral line and the capacitors are in the line side of the filter are shown in phantom at 134, 136, and 138, while in the load side, the distributive capacitors are shown in phantom at 140, 142, and 144. Once again, the one and one-half microfarad high-efficiency, metal-coated, dielectric-film capacitors 146, 148, and 150 are arranged from line-to-line. The distributive capacitance shown in the filter of FIG. 4 is provided by a portion of a circuit board similar to that shown in FIG. 2, with the exception that because it is necessary to provide three individual distributive capacitances in both the line and the load side, the portion of the circuit board will have six lands arranged on the upper surface in place of the four lands shown in FIG. 2. Again, a single bottom conductor or ground plane is provided and, thus, the bottommost conductor would be connected to the neutral line 106 in the circuit of FIG. 4. Similarly, because the inductor is required to provide four inductances there will be four windings arranged in a common fashion on a multiple core assembly. In order to achieve the desired inductance, it is necessary to employ at least two ferrite cores as explained in relation to the inductor shown in FIG. 3.

The present invention also provides an additional capability in addition to the filtering by providing a number of electrical outlets which are energized with power which has been cleaned up or filtered. FIG. 5 shows a parallel conductor arrangement to which is connected a number of electrical outlets, such as 180, 182, and 184. This outlet arrangement is intended to be connected to the inventive filter, such as the one shown in FIG. 1. In this regard, the three lines 174, 176, and 178 shown collectively at 186 would be connected to the load side of the three lines of FIG. 1. Additional lumped parameter capacitors are provided in this circuit and are connected as the capacitors in FIG. 1. Specifically, lumped parameter capacitor 188 is connected from the phase side 174 to the neutral or ground 178 and fixed capacitor 190 is connected to the neutral or return line 176 to the ground line 178.

These lumped parameter capacitors may be provided for every two or three outlets and, thus, two additional capacitors, 192 and 194, are also connected between the phase and neutral wires and the neutral and ground wires. The power conductors 174, 176, and 178 are formed in this embodiment not of wires, but rather as metal conductors arranged on one surface of section printed circuit board material, similar to FIG. 2. Specifically, conductor 178 is formed as the ground plane or bottommost conductor formed on the glass substrate of the printed circuit board and conductors 174 and 176 are formed as individual strips or longitudinal conductors on the top surface of the glass substrate. Again, suitable apertures may be formed in these conductors to facilitate connection of the lumped parameter components. Following the teaching of the present invention, the circuit board itself provides distributive capacitance at predetermined frequencies and, thus, there is a fixed amount of distributive capacitance provided by each specific unit of linear length of conductors. Accordingly, FIG. 5 shows distributive capacitance being provided at 196, 198, 200, 202, 204, and 206. Such capacitances are from the appropriate phase or neutral line to the ground line. There is no theoretical limitation on the number of outlets which may be connected using this inventive circuit, however, there are power limitations as to how many individual units should be connected in a single circuit.

The embodiment of FIG. 5 is intended for combination with the embodiment of FIG. 1 so that all of the specific units which make up a computing installation may be connected to a single main power filter, i.e., the filter of FIG. 1. Accordingly, it may be seen that by combining the circuits of FIGS. 1 and 5 a number of outlets are provided each with additional distributive capacitance from line to ground to suppress any transients or the like which may be present at the outlets or which may have gotten through the main power line filter, shown in FIG. 1.

It is understood that the foregoing is presented by way of example only and is not intended to limit the scope of the present invention, except as set forth in the appended claims.

What is claimed is:

1. A bidirectional filter for connection in the phase, neutral, and ground lines of a power distribution system, comprising:
   first and second inductors arranged in the phase and neutral lines, respectively;
   at least one lumped parameter capacitor connected between the phase line and the ground line and the neutral line and the ground line electrically before and electrically after said inductors in said phase and neutral lines; and
   distributive capacitance means connected in shunt electrically with each of said lumped parameter capacitors from the phase line to the ground line and from the neutral line to the ground line, respectively.

2. The filter of claim 1, wherein said distributive capacitance means is formed as a double-clad printed circuit board.

3. The filter of claim 2, wherein said circuit board is formed having a glass substrate with a first conductor covering substantially all of a first planar surface thereof and a second planar surface having a plurality of individual conductor areas arranged thereon in a predetermined pattern, said individual areas not being in electrical contact one with another.

4. The filter of claim 3, wherein the neutral line is connected to said first conductor and said inductors and said at least one lumped parameter capacitor are electrically connected to said plurality of individual conductor areas.

5. The filter of claim 4, wherein said plurality of individual conductor areas comprise second, third, fourth, and fifth conductor areas are arranged on said second planar surface and wherein said first inductor is electrically connected between said second and third conductor areas and said second inductor is electrically connected between said fourth and fifth conductor areas and said lumped parameter capacitors are connected between said first, second, third, and fourth areas and said conductors on said first planar surface of said printed circuit board.

6. The filter of claim 1, wherein said first and second inductors are formed as common core inductors.

7. The filter of claim 6, wherein said cores are ferrite formed of manganese and zinc, each having a different permeability versus frequency response curve.

8. The filter of claim 1, further comprising a printed circuit board having a first conductor covering substantially all of a first planar surface of a dielectric substrate of said printed circuit board and being electrically connected to the ground line of the power distribution system and second and third longitudinal conductor areas arranged on a second planar surface of the substrate of said printed circuit board, and a plurality of parallel connected electrical outlet means electrically connected to said second and third longitudinal conductor areas and to said first conductor.

9. A bidirectional power line filter for use in a three-phase, Y-connected power distribution system comprising:
   four inductors, one electrically connected in series in each of the phase power lines and in the neutral line of said three-phase, Y-connected power distribution system;
   a plurality of lumped parameter capacitors, at least one being connected between each of the phase lines and the neutral line electrically before and electrically after said inductors in said power lines; and
   distributive capacitance formed as double-clad printed circuit board for providing distributive capacitance in electrical shunt with each of said plurality of lumped parameter capacitors.

10. The filter of claim 9, wherein said four inductors are formed as having a common core having multiple concentric cores.

11. The filter of claim 10, wherein said multiple cores are formed of manganese-zinc ferrite, each core of said multiple having a different permeability versus frequency response curve.

12. The filter of claim 9, wherein said printed circuit board is formed having a glass substrate and being at least 1/64 inch thick.

13. The filter of claim 9, wherein said circuit board has a glass substrate with a first conductor covering substantially all of a first planar surface and having a second planar surface having at least six individual conductor areas arranged in a specific pattern thereon and each conductor area being out of electrical contact with the other.

14. The filter of claim 13, wherein the neutral line of the three-phase, Y-connected power distribution system is connected to said first conductor on said first planar surface of said printed circuit board and said four inductors and said plurality of lumped parameter capacitors are electrically connected to said six individual areas.

* * * * *